(12) United States Patent
Jeong et al.

(10) Patent No.: US 10,790,337 B2
(45) Date of Patent: Sep. 29, 2020

(54) ORGANIC LIGHT EMITTING DIODE DISPLAY INCLUDING CAPPING LAYER HAVING OPTICAL THICKNESS FOR IMPROVING OPTICS

(71) Applicant: Samsung Display Co., Ltd., Yongin-si (KR)

(72) Inventors: Hee Seong Jeong, Seoul (KR); Won Ju Kwon, Cheonan-si (KR); Dal Ho Kim, Hwaseong-si (KR); Gi-Na Yoo, Yongin-si (KR); Dong Jin Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/288,002

(22) Filed: Feb. 27, 2019

(65) Prior Publication Data

US 2019/0198578 A1    Jun. 27, 2019

Related U.S. Application Data

(63) Continuation of application No. 15/097,871, filed on Apr. 13, 2016, now abandoned.

(30) Foreign Application Priority Data

Oct. 2, 2015   (KR) .................. 10-2015-0138975

(51) Int. Cl.
*H01L 27/32* (2006.01)
*H01L 51/50* (2006.01)
*H01L 51/52* (2006.01)

(52) U.S. Cl.
CPC ...... *H01L 27/3211* (2013.01); *H01L 27/3262* (2013.01); *H01L 27/3265* (2013.01);
(Continued)

(58) Field of Classification Search
CPC ............ H01L 27/3211; H01L 27/3262; H01L 27/3265; H01L 51/5056; H01L 51/5072; H01L 51/5092

See application file for complete search history.

(56) References Cited

U.S. PATENT DOCUMENTS 8,698,395 B2   4/2014   Im et al.
8,928,013 B2   1/2015   Matsuda
(Continued)

FOREIGN PATENT DOCUMENTS

CN   1797810    7/2006
CN   102074659   5/2011
(Continued)

OTHER PUBLICATIONS

The Extended European Search Report dated Feb. 21, 2017, in European Patent Application No. 16169616.6.
(Continued)

*Primary Examiner* — Matthew E. Gordon
(74) *Attorney, Agent, or Firm* — H.C. Park & Associates, PLC

(57) ABSTRACT

An OLED display including first, second, and third color pixels each including a first electrode, an organic emission layer, a second electrode, and a capping layer disposed on the disposed on the substrate, in which the first color pixel is configured to emit green light, and the second and third color pixels are each configured to emit a color of light other than green, the organic emission layer of the first color pixel includes a first emission layer and a second emission layer each being configured to emit light, the organic emission layer of the second color pixel or in the third color pixel includes a third emission layer configured to emit light, the second emission layer and the third emission layer include
(Continued)

both a host and a dopant, and the first emission layer includes the host, and does not include any dopants therein.

13 Claims, 24 Drawing Sheets

(52) U.S. Cl.
CPC ........ *H01L 27/3276* (2013.01); *H01L 51/504* (2013.01); *H01L 51/5012* (2013.01); *H01L 51/5056* (2013.01); *H01L 51/5072* (2013.01); *H01L 51/5092* (2013.01); *H01L 51/5237* (2013.01); *H01L 51/5253* (2013.01); *H01L 51/5275* (2013.01); *H01L 51/5016* (2013.01); *H01L 2251/558* (2013.01)

(56) References Cited

U.S. PATENT DOCUMENTS

| | | | |
|---|---|---|---|
| 8,987,714 B2 | 3/2015 | Im et al. | |
| 9,196,859 B2 | 11/2015 | Sim et al. | |
| 9,515,279 B2 | 12/2016 | Ishisone et al. | |
| 2006/0113907 A1 | 6/2006 | Im et al. | |
| 2006/0279203 A1* | 12/2006 | Forrest | H01L 51/5096 313/504 |
| 2008/0286610 A1 | 11/2008 | Deaton et al. | |
| 2011/0114973 A1* | 5/2011 | Matsuda | H01L 51/5253 257/89 |
| 2012/0319145 A1 | 12/2012 | Weaver et al. | |
| 2014/0361272 A1 | 12/2014 | Joo et al. | |
| 2015/0053958 A1 | 2/2015 | Ishisone et al. | |
| 2016/0056401 A1* | 2/2016 | Lee | H01L 51/5016 257/40 |
| 2017/0098686 A1 | 4/2017 | Jeong et al. | |

FOREIGN PATENT DOCUMENTS

| | | |
|---|---|---|
| CN | 105474749 | 4/2016 |
| EP | 3151300 | 4/2017 |
| KR | 10-0700013 | 3/2007 |
| KR | 10-2013-0092725 | 8/2013 |
| KR | 10-2014-0143545 | 12/2014 |
| KR | 10-2014-0144997 | 12/2014 |
| KR | 10-2015-0041360 | 4/2015 |
| KR | 10-2015-0069577 | 6/2015 |

OTHER PUBLICATIONS

Non-Final Office Action dated Aug. 9, 2017 issued in U.S. Appl. No. 15/097,871.
Final Office Action dated Mar. 9, 2018 issued in U.S. Appl. No. 15/097,871.
Non-Final Office Action dated Aug. 10, 2018 issued in U.S. Appl. No. 15/097,871.
Non-Final Office Action dated Dec. 11, 2018 issued in U.S. Appl. No. 15/097,871.
First Office Action dated May 7, 2019, issued in Chinese Patent Application No. 201610425260.2.

* cited by examiner

ORGANIC LIGHT EMITTING DIODE DISPLAY INCLUDING CAPPING LAYER HAVING OPTICAL THICKNESS FOR IMPROVING OPTICS

CROSS-REFERENCE TO RELATED APPLICATION

This application is a continuation of U.S. application Ser. No. 15/097,871, filed on Apr. 13, 2016, and claims priority from and the benefit of Korean Patent Application No. 10-2015-0138975, filed in on Oct. 2, 2015, which are hereby incorporated by reference for all purposes as if fully set forth herein.

BACKGROUND

Field

Exemplary embodiments relate to an organic light emitting diode (OLED) display, and, more particularly, to an OLED display with increased luminous efficiency and improved viewing angle.

Discussion of the Background

An organic light emitting diode (OLED) display may include two electrodes and an organic emission layer interposed therebetween. The electrons injected from one electrode and holes injected from the other electrode may be combined in the organic emission layer to generate excitons. Light may be emitted as the excitons release energy, when the excitons change from an excited state to a ground state.

An OLED display includes pixels including an OLED, as a self-emissive element, transistors for driving the OLED, and at least one capacitor formed in each pixel. The transistors may generally include a switching transistor and a driving transistor.

A capping layer may be formed on the electrodes to protect the electrodes of the OLED display. Accordingly, luminous efficiency of light emitted from the organic emission layer may be affected by the capping layer. However, as luminous efficiency increases, strong resonance may occur, which may generate color shift associated with a viewing angle. That is, a difference in color may appear between front and side views of a screen.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode (OLED) display that may improve luminous efficiency thereof.

Exemplary embodiments also provide an OLED display that may improve a viewing angle by reducing color shift associated with a viewing angle.

Additional aspects will be set forth in the detailed description which follows, and, in part, will be apparent from the disclosure, or may be learned by practice of the inventive concept.

According to an exemplary embodiment of the present invention, an organic light emitting diode (OLED) display includes a substrate, a first electrode disposed on the substrate, an organic emission layer disposed on the first electrode, a second electrode disposed on the organic emission layer, and a capping layer disposed on the second electrode, in which an optical thickness of the capping layer is in a range of about 1100 Å to about 1400 Å.

According to an exemplary embodiment of the present invention, an organic light emitting diode (OLED) display includes a substrate, a first electrode disposed on the substrate, an organic emission layer disposed on the first electrode, a second electrode disposed on the organic emission layer, and a capping layer disposed on the second electrode, the capping layer including a first capping layer and a second capping layer having different refractive indices from each other, in which an optical thickness of the first capping layer is in a range of about 60 Å to 210 Å, and an optical thickness of the second capping layer is in a range of about 820 Å to about 1030 Å.

According to an exemplary embodiment of the present invention, an organic light emitting diode (OLED) display includes a first color pixel, a second color pixel, and a third color pixel on a substrate, each of the first, second, and third color pixels including a first electrode disposed on the substrate, an organic emission layer disposed on the first electrode, a second electrode disposed on the organic emission layer, and a capping layer disposed on the second electrode, in which the first color pixel is configured to emit green light, and the second and third color pixels are each configured to emit a color of light other than green, the organic emission layer of the first color pixel includes a first emission layer and a second emission layer each being configured to emit light, the organic emission layer of the second color pixel or the third color pixel includes a third emission layer configured to emit light, the second emission layer and the third emission layer include both a host and a dopant, and the first emission layer includes the host, and does not include any dopants therein.

According to exemplary embodiments of the present invention, an optical thickness of the capping layer may be controlled to improve the luminous efficiency and the viewing angle. In addition, the luminous efficiency and the viewing angle may be improved by including the host and the dopant in a first portion of regions of the emission layer and only the host in a second portion of regions thereof.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
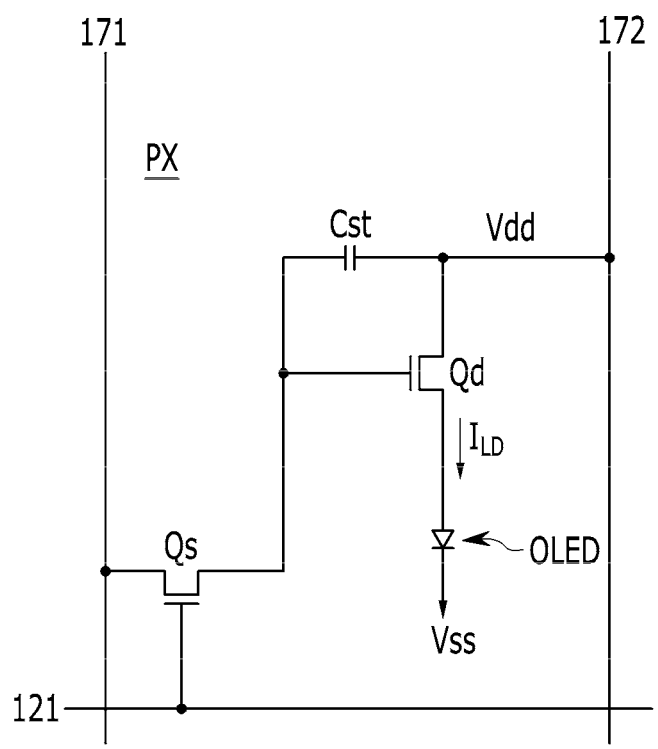
FIG. 1 is an equivalent circuit diagram of one pixel of an organic light emitting diode (OLED) display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, one pixel of an organic light emitting diode (OLED) display according to an exemplary embodiment of the present invention will be described.

FIG. 1 is an equivalent circuit diagram of one pixel of an OLED display according to an exemplary embodiment of the present invention.

Referring to FIG. 1, the OLED display according to the present exemplary embodiment includes signal lines 121, 171, and 172, and a pixel PX connected thereto. Although not illustrated, pixels PX may be arranged in a matrix form that includes pixel rows and pixel columns. In this case, the pixels PX are respectively connected to the signal lines 121, 171, and 172.

The signal lines 121, 171, and 172 include gate lines 121 for transmitting a gate signal (also referred to as a "scan signal"), data lines 171 for transmitting a data signal, and driving voltage lines 172 for transmitting a driving voltage Vdd. Only one of the gate lines 121, one of the data lines 171, and one of the driving voltage lines 172 are illustrated in FIG. 1, but the gate line 121, data line 171, and driving voltage line 172 may be formed in plural. The gate lines 121 substantially extend in a row direction and are substantially parallel to each other. The data lines 171 and the driving voltage lines 172 extend in a column direction to cross the gate lines 121 and are substantially parallel to each other.

The OLED display according to the present exemplary embodiment includes a switching thin-film transistor Qs, a driving thin-film transistor Qd, a storage capacitor Cst, and an organic light emitting diode (OLED).

The switching thin-film transistor Qs includes a control terminal, an input terminal, and an output terminal. The control terminal of the switching thin-film transistor Qs is connected to the gate line 121, the input terminal thereof is connected to the data line 171, and the output terminal thereof is connected to the driving thin-film transistor Qd. The switching thin-film transistor Qs transmits the data signal applied to the data line 171 to the driving thin-film transistor Qd, in response to the gate signal applied to the gate line 121.

The driving thin-film transistor Qd has a control terminal, an input terminal, and an output terminal. The control terminal of the driving thin-film transistor Qd is connected to the switching thin-film transistor Qs, the input terminal thereof is connected to the driving voltage line 172, and the output terminal thereof is connected to the OLED. The driving thin-film transistor Qd outputs an output current $I_{LD}$, an amount of which varies depending on a voltage applied between the control terminal and the output terminal of the driving thin-film transistor Qd.

The storage capacitor Cst is connected between the control terminal and input terminal of the driving thin-film transistor Qd. The storage capacitor Cst is charged by the data signal applied to the control terminal of the driving thin-film transistor Qd, and maintains the data signal even after the switching thin-film transistor Qs is turned off.

The OLED has an anode connected to the output terminal of the driving thin-film transistor Qd, and a cathode connected to a common voltage Vss. The OLED displays an image by emitting light, the intensity of which varies depending on the output current $I_{LD}$ of the driving thin-film transistor Qd. The connection relationship between the switching thin-film transistor Qs, the driving thin-film transistor Qd, the storage capacitor Cst, and the OLED may vary widely. In addition, additional thin-film transistors may be included in one pixel PX.

Hereinafter, the OLED display according to an exemplary embodiment of the present invention will be described in detail.

Figure 2:
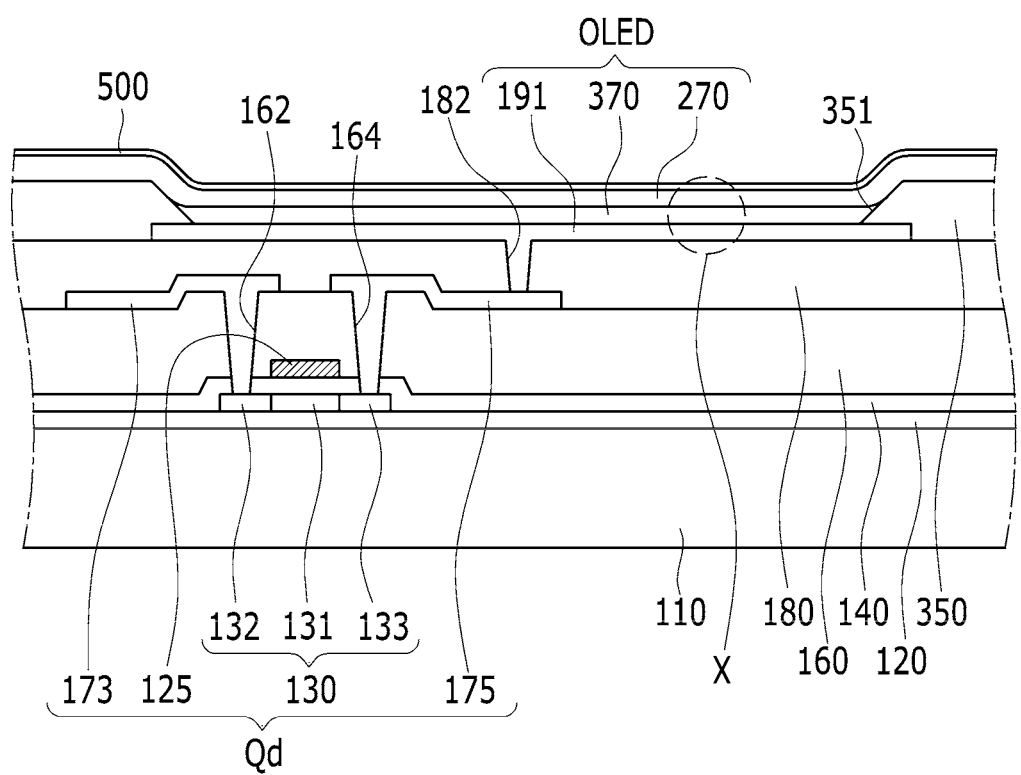
FIG. 2 is a cross-sectional view of an OLED display according to an exemplary embodiment of the present invention.

FIG. 2 is a cross-sectional view of the OLED display according to an exemplary embodiment of the present invention.

Referring to FIG. 2, the OLED display according to the present exemplary embodiment includes a substrate 110, a driving thin-film transistor Qd formed on the substrate 110, a pixel electrode 191 connected to the driving thin-film transistor Qd, an organic emission layer 370 formed on the pixel electrode 191, and a common electrode 270 formed on the organic emission layer 370.

The substrate 110 is an insulating substrate that is formed of glass, quartz, ceramic, plastic, etc. The substrate 110 may alternatively be a metallic substrate that is formed of stainless steel or the like.

A buffer layer 120 may be disposed on the substrate 110. The buffer layer 120 may be formed as a single layer of silicon nitride ($SiN_x$), or a dual layer of silicon nitride ($SiN_x$) and silicon oxide ($SiO_x$). The buffer layer 120 may planarize a surface and prevent permeation of unnecessary materials, such as impurities or moisture. The buffer layer 120 may be omitted.

A driving semiconductor 130 is disposed on the buffer layer 120. The driving semiconductor 130 may include a polysilicon semiconductor material or an oxide semiconductor material. The driving semiconductor 130 includes a channel region 131 not doped with impurities, and contact doping regions 132 and 133 doped with impurities, which are disposed at opposite sides of the channel region 131. The contact doping regions 132 and 133 include a source region 132 and a drain region 133. In this case, the doped impurities may vary depending on a type of the thin-film transistor.

A gate insulating layer 140 is disposed on the driving semiconductor 130. The gate insulating layer 140 may include an inorganic insulating material, such as silicon nitride ($SiN_x$) or silicon oxide ($SiO_x$).

A gate wire including the driving gate electrode 125 is disposed on the gate insulating layer 140. In this case, the driving gate electrode 125 overlaps at least a portion of the driving semiconductor 130, in particular, the channel region 131 thereof.

An interlayer insulating layer 160 is disposed on the driving gate electrode 125 and the gate insulating layer 140. The interlayer insulating layer 160 may include an inorganic insulating material or an organic insulating material.

Contact holes 162 and 164 at least partially exposing the driving semiconductor 130 are formed in the gate insulating layer 140 and in the interlayer insulating layer 160. Particularly, the contact holes 162 and 164 expose the contact doping regions 132 and 133 of the driving semiconductor 130.

A data wire including a driving source electrode 173 and a driving drain electrode 175 are formed on the interlayer insulating layer 160. The driving source electrode 173 and the driving drain electrode 175 are respectively connected to the source and drain regions 132 and 133 of the driving semiconductor 130 via the contact holes 162 and 164.

In this manner, the driving semiconductor 130, the driving gate electrode 125, the driving source electrode 173, and the driving drain electrode 175 form the driving thin-film transistor Qd. It is noted that, however, the structure of the driving thin-film transistor Qd may be varied. The switching thin-film transistor Qs may include a switching semiconductor, a switching gate electrode, a switching source electrode, and a switching drain electrode.

A passivation layer 180 covering the data wire is disposed on the interlayer insulating layer 160. The passivation layer 180 may remove a step and planarize a surface thereof, thereby increasing luminous efficiency of the OLED to be formed thereon. A contact hole 182 at least partially exposing the driving drain electrode 175 is formed in the passivation layer 180.

The passivation layer 180 may include a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB). It is noted that, however, either one of the passivation layer 180 and the interlayer insulating layer 160 may be omitted.

The pixel electrode 191 is formed on the passivation layer 180. The pixel electrode 191 may include a transparent conductive material, such as indium tin oxide (ITO), indium zinc oxide (IZO), zinc oxide (ZnO), indium oxide ($In_2O_3$), etc., or a reflective metal such as lithium (Li), calcium (Ca), lithium fluoride/calcium (LiF/Al), lithium fluoride/aluminum (LiF/Al), aluminum (Ag), silver (Ag), magnesium (Mg), gold (Au), etc.

The pixel electrode 191 is electrically connected to the driving drain electrode 175 of the driving thin-film transistor Qd via the contact hole 182 formed in the passivation layer 180, and may be the anode of the OLED. Although not illustrated, the pixel electrode 191 may include first and second transparent electrodes including a transparent conductive material, and a transflective layer disposed between the first and second transparent electrodes, to form a microcavity along with the common electrode 270.

A pixel defining layer 350 is formed on the passivation layer 180 and an edge portion of the pixel electrode 191. The pixel defining layer 350 includes a pixel opening 351 that exposes the pixel electrode 191. The pixel defining layer 350 may include a polyacrylate resin, a polyimide resin, a silica-based inorganic material, etc.

An organic emission layer 370 is formed in the pixel opening 351 of the pixel defining layer 350. The organic emission layer 370 may include at least one of an emission layer, a hole injection layer (HIL), a hole transporting layer (HTL), an electron transporting layer (ETL), and an electron injection layer (EIL). A structure of the organic emission layer 370 will be described in detail with reference to FIG. 3.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer are respectively formed on red, green, and blue pixels, to implement a color image.

Alternatively, in the organic emission layer 370, a color image may be implemented by disposing all of the red, green, and blue organic light emission layers on the red pixel, the green pixel, and the blue pixel, and then forming red, green, and blue color filters for each pixel. As another example, a color image may be implemented by forming a white organic emission layer emitting white light on all of the red, green, and blue pixels, and respectively forming red, green, and blue color filters for each pixel. When the color image is implemented by using the white organic emission layer and the color filter, a deposition mask for depositing the red, green, and blue organic emission layers on each pixel, that is, the red, green, and blue pixels, may not be utilized.

The white organic emission layer described above may be formed as a single organic emission layer, and may further include a structure for emitting white light by disposing multiple organic emission layers. For example, a structure for emitting white light by combining at least one yellow organic emission layer with at least one blue organic emission layer, at least one cyan organic emission layer with at least one red organic emission layer, and at least one magenta organic emission layer with at least one green organic emission layer may be included.

The common electrode 270 is formed on the pixel defining layer 350 and on the organic emission layer 370. The common electrode 270 may include a transparent conductive material, such as indium tin oxide (ITO), indium zinc oxide (IZO), zinc oxide (ZnO), indium oxide ($In_2O_3$), etc., or a reflective metal such as lithium (Li), calcium (Ca), lithium fluoride/calcium (LiF/Al), lithium fluoride/aluminum (LiF/Al), aluminum (Ag), silver (Ag), magnesium (Mg), gold (Au), etc. The common electrode 270 may be the cathode of the OLED. The pixel electrode 191, the organic emission layer 370, and the common electrode 270 form the OLED.

A capping layer 500 is disposed on the common electrode 270. The capping layer 500 is formed in a top emission type of OLED, to prevent incident light on the common electrode 270 from being totally reflected, and, thus, experiencing light loss. The capping layer 500 may include an organic material or an inorganic material. For example, the capping layer 500 may include a triamine derivative, an arylenediamine derivative, CBP, tris(8-hydroxyquinoline) aluminum ($Alq_3$), etc.

An optical thickness of the capping layer 500 may be about 1100 Å or more and about 1400 Å or less. As used herein, an optical thickness may be defined by the physical thickness multiplied by the refractive index thereof. A refractive index of the capping layer 500 may be about 1.6 or more and about 2.6 or less. For example, when the refractive index of the capping layer 500 is about 1.87, a physical thickness of the capping layer 500 may be about 600 Å or more and about 730 Å or less. That is, the optical thickness of the capping layer 500 is about 600 Å*1.87 or more and about 730 Å*1.87 or less. When the refractive index of the capping layer 500 is about 1.6, the physical thickness of the capping layer 500 may be about 700 Å or more and about 860 Å or less. When the refractive index of the capping layer 500 is about 2.6, the physical thickness of the capping layer 500 is about 430 Å or more and about 530 Å or less. Accordingly, a value range of the desirable physical thickness of the capping layer 500 may vary, depending on the refractive index of the capping layer 500.

A value of the optical thickness represents the optical thickness at a wavelength of about 550 nm. That is, the optical thickness is a value obtained by multiplying the physical thickness by the refractive index, when light of about 550 nm passes through the capping layer 500.

Although not illustrated, a thin film encapsulation layer may be further formed on the capping layer 500. The thin film encapsulation layer may seal and protect the OLED and the driving circuit unit disposed on the substrate 110 from the outside.

Hereinafter, the OLED according to an exemplary embodiment of the present invention will be described in detail.

Figure 3:
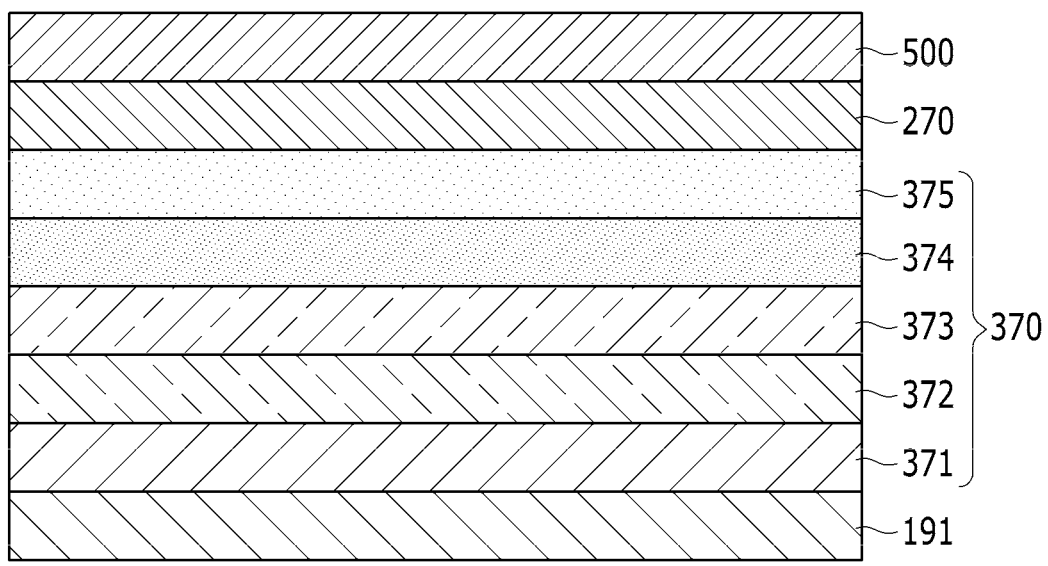
FIG. 3 is an enlarged cross-sectional view of an OLED of an OLED display according to an exemplary embodiment of the present invention.

FIG. 3 is an enlarged cross-sectional view of the OLED of the OLED display according to an exemplary embodiment of the present invention.

The OLED of the OLED display according to the present exemplary embodiment (indicated as X in FIG. 2) has a structure, in which the pixel electrode 191, the hole injection layer 371, the hole transporting layer 372, the emission layer 373, the electron transporting layer 374, the electron injection layer 375, the common electrode 270, and the capping layer 500 are sequentially disposed. That is, the organic emission layer 370 of FIG. 2 includes the hole injection layer 371, the hole transporting layer 372, the emission layer 373, the electron transporting layer 374, and the electron injection layer 375 of FIG. 3.

The hole injection layer 371 may be formed on the pixel electrode 191. In this case, the hole injection layer 371 may be an arbitrary layer for improving injection of holes from the pixel electrode 191 into the hole transporting layer 372. The hole injection layer 371 may include copper phthalocyanine (CuPc), poly(3,4-ethylenedioxythiophene) (PEDOT), Polyaniline (PANT), N,N-dinaphthyl-N,N'-diphenyl benzidine (NPD), and the like.

The hole transporting layer 372 may be formed on the hole injection layer 371. The hole transporting layer 372 may perform a function of smoothly transporting the holes transmitted from the hole injection layer 371. For example, the hole transporting layer 372 may include N,N-dinaphthyl-N,N'-diphenyl benzidine (NPD), TPD (N,N'-bis-(3-methylphenyl)-N,N'-bis-(phenyl)-benzidine), s-TAD, (4,4',4"-tris (N-3-methylphenyl-N-phenyl-amino)-triphenylamine), and the like.

In the present exemplary embodiment, the hole transporting layer 372 is described as to be disposed on the hole injection layer 371, thus forming a laminated structure. The hole injection layer 371 and the hole transporting layer 372 may alternatively be formed as a single layer.

Although not illustrated, a buffer layer (not shown) may be further disposed on the hole transporting layer 372. The buffer layer may adjust an amount of holes transferred to the emission layer 373 from the pixel electrode 191, in addition to an amount of electrons penetrating the hole transporting layer 372 from the emission layer 373. That is, the buffer layer may control the amount of holes and block the electrons, help to combine the hole and the electrons in the emission layer 373, and block the electrons from penetrating the hole transporting layer 372, thereby preventing the hole transporting layer 372 from being damaged by the electrons.

The emission layer 373 includes a light-emitting material that exhibits a specific color. For example, the emission layer 373 may exhibit primary colors, such as blue, green, and red, or a combination of these colors. According to the present exemplary embodiment, the emission layer 373 may include a blue emission layer, a green emission layer, and a red emission layer.

The emission layer 373 includes a host and a dopant. The emission layer 373 may include a material that emits red, green, blue, and white light, and may be formed using a phosphorescent or fluorescent material.

When emitting red light, the emission layer 373 includes a host material that includes CBP (carbazole biphenyl) or mCP (1,3-bis(carbazol-9-yl), and may be made of a phosphorescent material including a dopant, which includes at least one of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (octaethylporphyrin platinum), or alternatively, may be made of a fluorescent material including PBD:Eu (DBM)3(Phen) or perylene.

When emitting green light, the emission layer 373 includes a host material that includes CBP or mCP, and may be made of a phosphorescent material that includes a dopant material, which includes Ir(ppy)3 (fac-tris(2-phenylpyridine)iridium), or alternatively, may be made of a fluorescent material including $Alq_3$ (tris(8-hydroxyquinolino)aluminum).

When emitting blue light, the emission layer 373 includes a host material including CBP or mCP, and may be made of a phosphorescent material that includes a dopant material, which includes (4,6-F2ppy)2Irpic. Alternatively, the emission layer 373 may be made of a fluorescent material including at least one of spiro-DPVBi, spiro-6P, distyryl benzene (DSB), distyrylarylene (DSA), a PFO-based polymer, and a PPV-based polymer.

The electron transporting layer 374 may be disposed on the emission layer 373. In this case, the electron transporting layer 374 may transfer electrons from the common electrode 270 to the emission layer 373. The electron transporting layer 374 may prevent holes injected from the pixel electrode 191 from passing through the emission layer 373 and then moving to the common electrode 270. That is, the electron transporting layer 374 serves as a hole blocking layer, and helps to combine the holes and electrons in the emission layer 373. In this case, the electron transporting layer 374 may include at least one of tris(8-hydroxyquinolino)aluminum (Alq₃), PBD, TAZ, Spiro-PBD, BAlq, and SAlq.

The electron injection layer 375 is disposed on the electron transporting layer 374. The electron injection layer 375 is an arbitrary layer that may improve the injection of the electrons from the common electrode 270 into the electron transporting layer 374. The electron injection layer 375 may include Alq₃, LiF, a gallium (Ga) complex, PBD, etc.

Hereinafter, luminous efficiency associated with a thickness of the capping layer of the OLED display according to an exemplary embodiment of the present invention will be described with reference to FIGS. 4 to 7.

Figure 4:
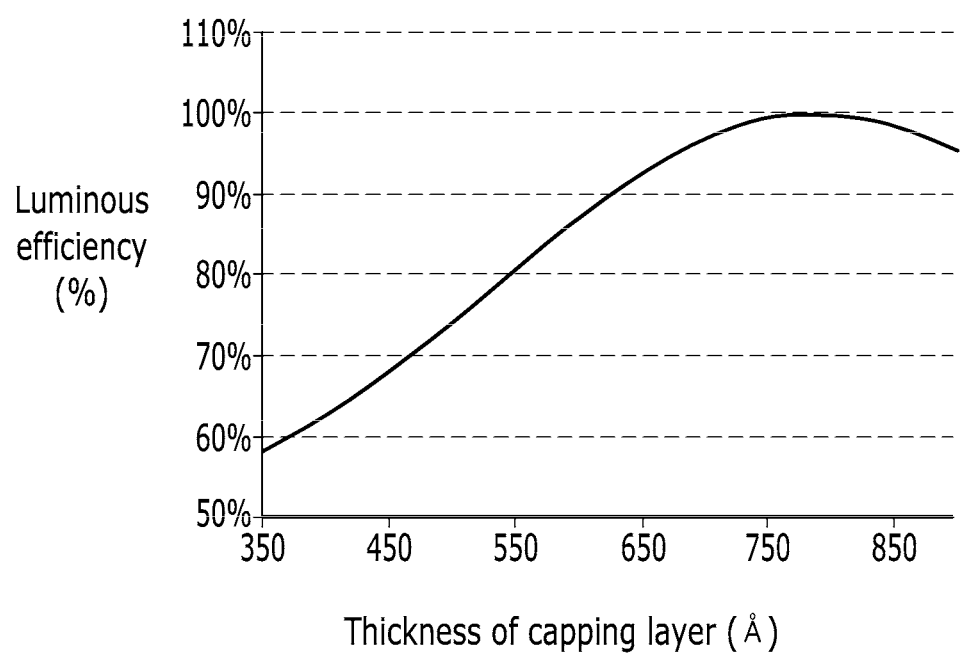
FIG. 4 is a graph showing luminous efficiency of white light associated with a thickness of a capping layer of an OLED display according to an exemplary embodiment of the present invention.
Figure 5:
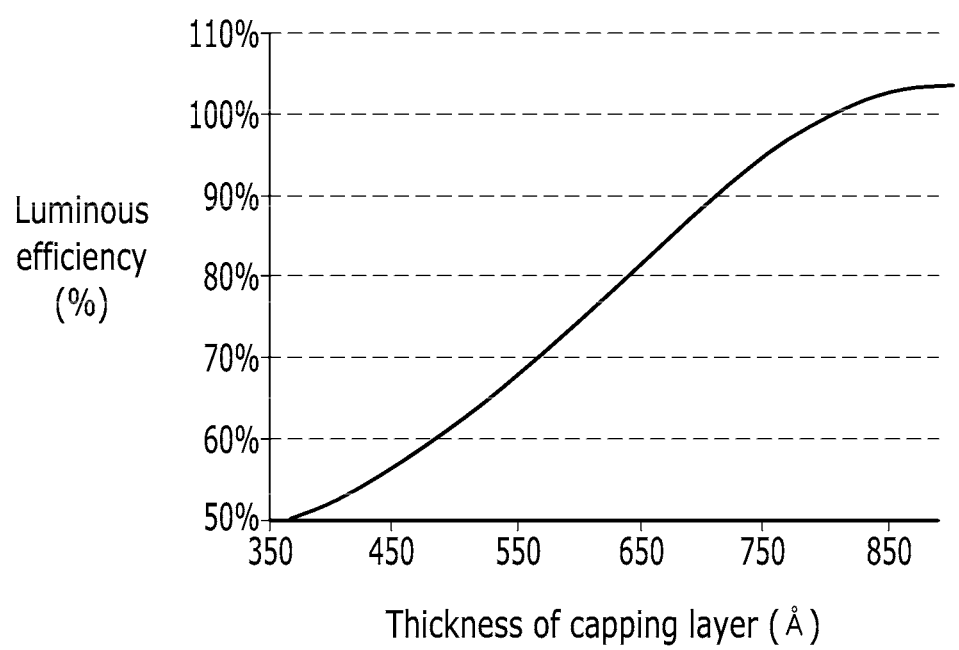
FIG. 5 is a graph showing luminous efficiency of red light associated with a thickness of a capping layer of an OLED display according to an exemplary embodiment of the present invention.
Figure 6:
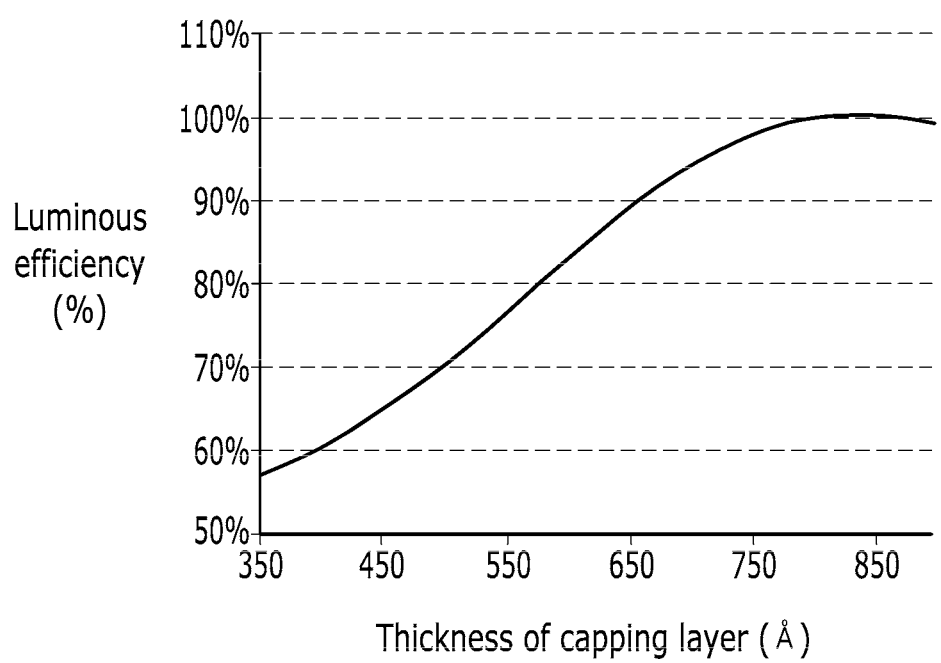
FIG. 6 is a graph showing luminous efficiency of green light associated with a thickness of a capping layer of an OLED display according to an exemplary embodiment of the present invention.
Figure 7:
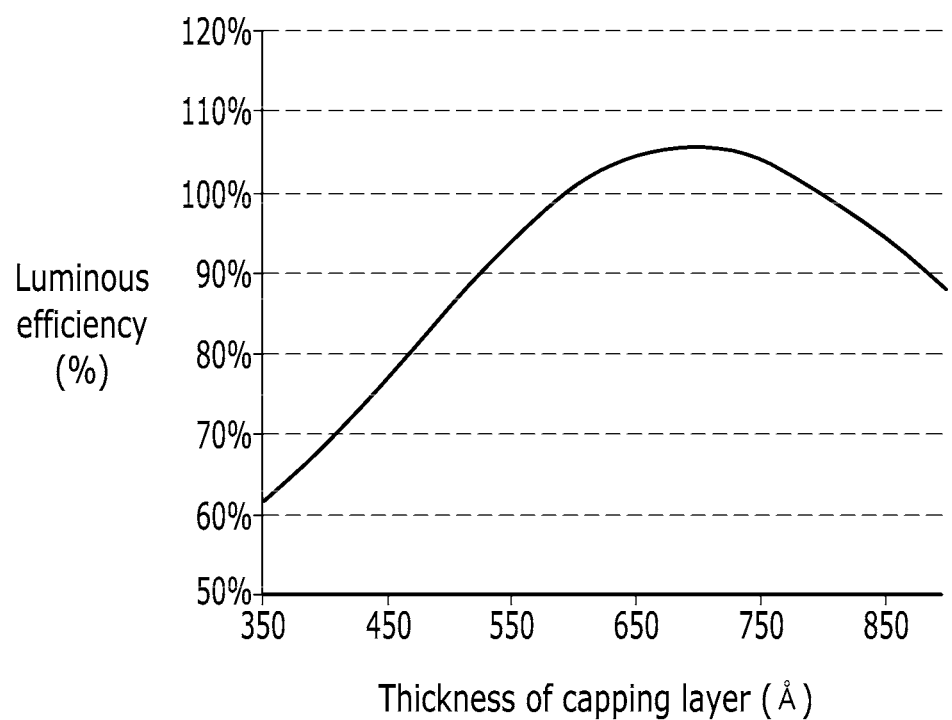
FIG. 7 is a graph showing luminous efficiency of blue light associated with a thickness of a capping layer of an OLED display according to an exemplary embodiment of the present invention.

FIG. 4 is a graph showing luminous efficiency of white light associated with a thickness of a capping layer of the OLED display according to an exemplary embodiment of the present invention. FIG. 5 is a graph showing luminous efficiency of red light associated with the thickness of the capping layer of the OLED display according to an exemplary embodiment of the present invention. FIG. 6 is a graph showing luminous efficiency of green light associated with the thickness of the capping layer of the OLED display according to an exemplary embodiment of the present invention. FIG. 7 is a graph showing luminous efficiency of blue light associated with the thickness of the capping layer of the OLED display according to an exemplary embodiment of the present invention.

As shown in FIG. 4, as the thickness of the capping layer increases from about 350 Å to about 830 Å, luminous efficiency of white light gradually increases. When the thickness of the capping layer increases at a point where the thickness of the capping layer is about 830 Å, the luminous efficiency of white light gradually decreases.

As shown in FIG. 5, as the thickness of the capping layer increases from about 350 Å to about 900 Å, luminous efficiency of red light gradually increases.

As shown in FIG. 6, as the thickness of the capping layer increases from about 350 Å to about 850 Å, luminous efficiency of green light gradually increases.

As shown in FIG. 7, as the thickness of the capping layer increases from about 350 Å to about 700 Å, luminous efficiency of blue light gradually increases. When the thickness of the capping layer increases from a point where the thickness of the capping layer is about 700 Å, the luminous efficiency of blue light gradually decreases.

Referring to the graphs illustrated in FIGS. 4 to 7, it can be seen that the luminous efficiency is affected as the thickness of the capping layer of the OLED display varies. In particular, as the thickness of the capping layer 500 increases, the luminous efficiency gradually increases, and if it exceeds a predetermined thickness, the luminous efficiency gradually decreases. Luminous efficiency of red or green light continues to gradually increase as the thickness of the capping layer increases. As the thickness of the capping layer increases, the luminous efficiency of blue light increases, but then gradually decreases once it exceeds a predetermined thickness. Characteristics of luminous efficiency of white light substantially reflect those of blue light. This is because the blue pixel represents about half the total power consumption of the red, green, and blue pixels. Accordingly, when power consumption of the blue pixel is reduced, the entire power consumption of the pixels may be reduced, thereby increasing luminous efficiency of white light.

When luminous efficiency of white light is the highest, the thickness of the capping layer is about 830 Å. When the thickness of the capping layer is about 830 Å, luminous efficiency of blue light is about 100%. Luminous efficiency of blue light is about the similar level, i.e., 100%, when the thickness of the capping layer is about 600 Å. Since the luminous efficiency of the blue pixel is closely associated with the entire luminous efficiency of the pixels, the thickness of the capping layer may be about 600 Å or more. When the thickness of the capping layer is about 600 Å or less, the luminous efficiency significantly decreases and thus the power consumption increases.

In FIGS. 4 to 7, the thickness of the capping layer represents a physical thickness, and the graphs of FIGS. 4 to 7 show experimental results when a refractive index thereof is about 1.87. Accordingly, the optical thickness of the capping layer may be about 600 Å*1.87 or more, i.e., about 1100 Å or more.

Hereinafter, an amount of color shift associated with the thickness of the capping layer of the OLED display according to an exemplary embodiment of the present invention will be described with reference to FIGS. 8 to 11. As used herein, the amount of color shift may be a variation in color that is associated with a viewing angle, which represents a difference in color between a front view and a side view. As the amount of color shift increases, the difference in color associated with the viewing angle increases. When the amount of color shift is reduced, the viewing angle may be improved. The amount of color shift is digitized as u'v'.

Figure 8:
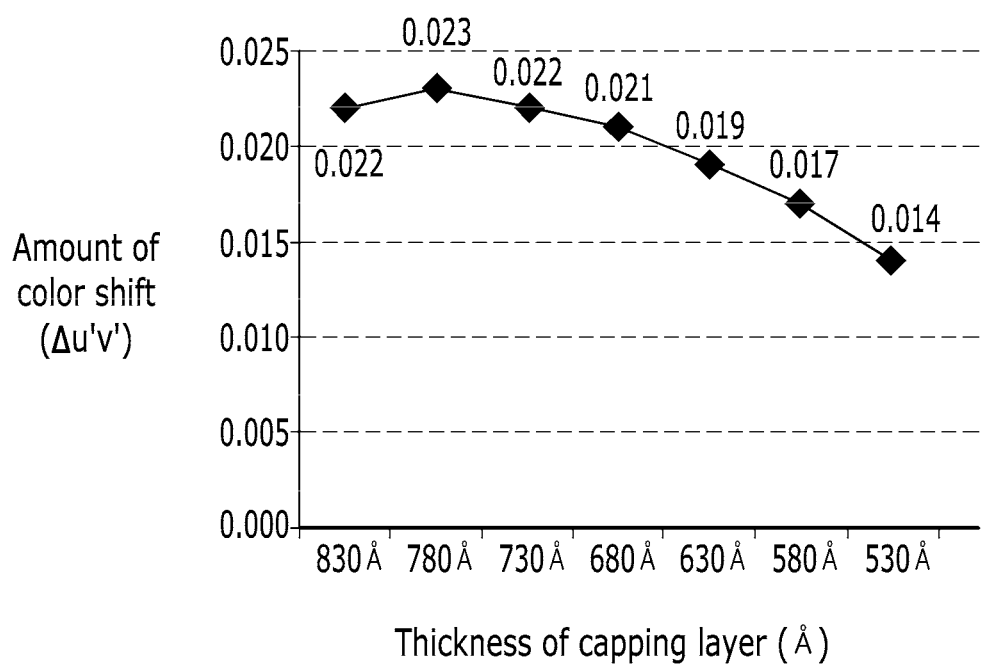
FIG. 8 is a graph showing an amount of color shift for white associated with a thickness of a capping layer of an OLED display according to an exemplary embodiment of the present invention.
Figure 9:
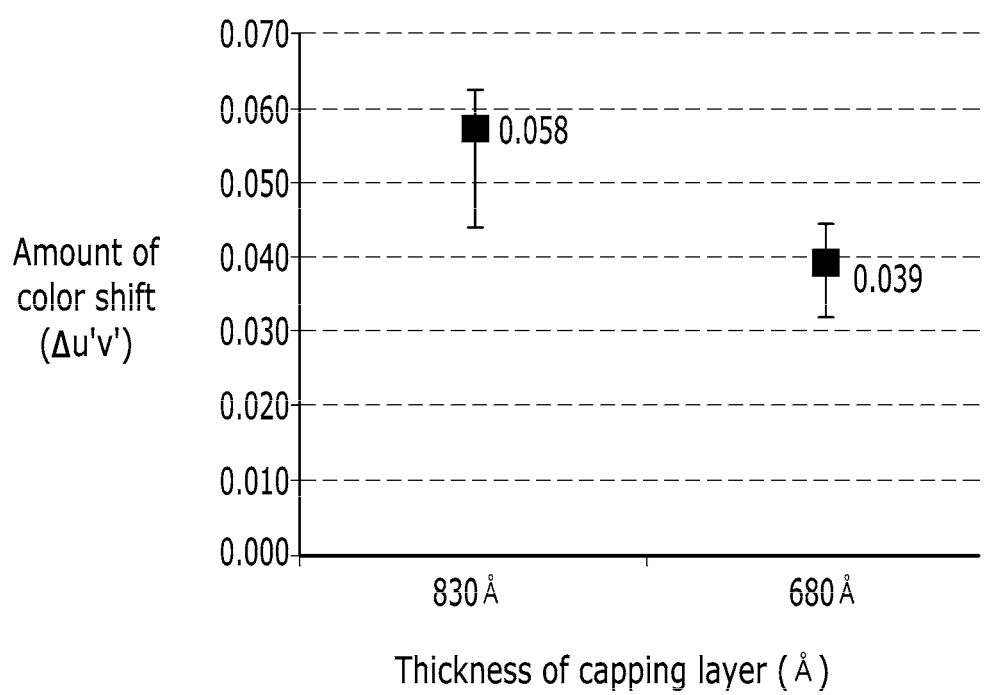
FIG. 9 is a graph showing an amount of color shift for red associated with a thickness of a capping layer of an OLED display according to an exemplary embodiment of the present invention.
Figure 10:
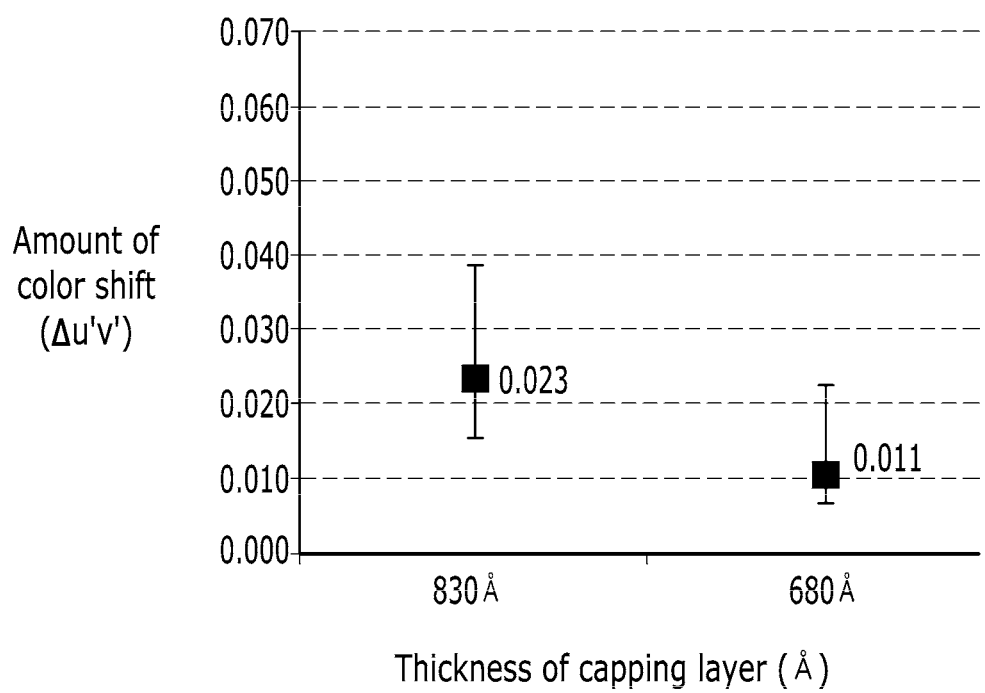
FIG. 10 is a graph showing an amount of color shift for green associated with a thickness of a capping layer of an OLED display according to an exemplary embodiment of the present invention.
Figure 11:
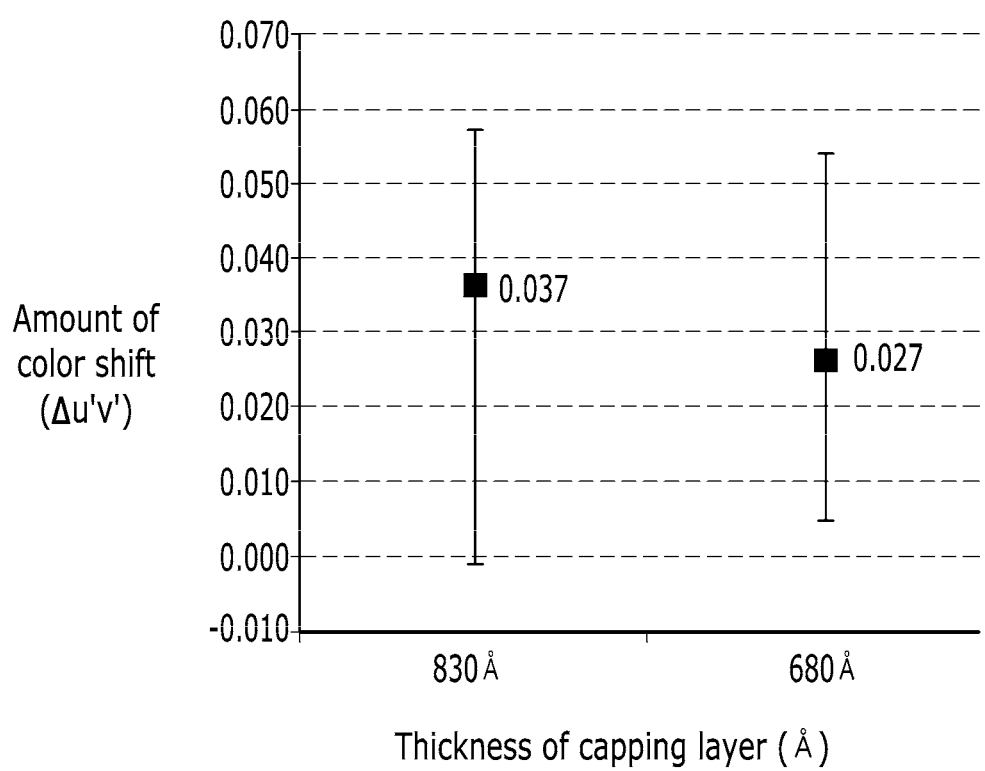
FIG. 11 is a graph showing an amount of color shift for blue associated with a thickness of a capping layer of an OLED display according to an exemplary embodiment of the present invention.

FIG. 8 is a graph showing an amount of color shift for white associated with the thickness of the capping layer of the OLED display according to an exemplary embodiment of the present invention. FIG. 9 is a graph showing an amount of color shift for red associated with the thickness of the capping layer of the OLED display according to an exemplary embodiment of the present invention. FIG. 10 is a graph showing an amount of color shift for green associated with the thickness of the capping layer of the OLED display according to an exemplary embodiment of the present invention. FIG. 11 is a graph showing an amount of color shift for blue associated with the thickness of the capping layer of the OLED display according to an exemplary embodiment of the present invention.

As shown in FIG. 8, when the thickness of the capping layer is about 830 Å to about 730 Å, an amount of color shift for white shows similar levels, and when the thickness of the capping layer is about 730 Å or less, the amount of color shift for white gradually decreases as the thickness of the capping layer decreases. When the thickness of the capping layer decreases from about 830 Å to about 780 Å, the amount of color shift for white slightly increases, and when the thickness of the capping layer is about 730 Å, the amount of color shift for white shows a level similar to that of about 830 Å.

As shown in FIG. 9, when the thickness of the capping layer decreases from about 830 Å to about 680 Å, an amount of color shift for red decreases from about 0.058 to about 0.039.

As shown in FIG. 10, when the thickness of the capping layer decreases from about 830 Å to about 680 Å, an amount of color shift for green decreases from about 0.023 to about 0.011.

As shown in FIG. 11, when the thickness of the capping layer decreases from about 830 Å to about 680 Å, an amount of color shift for blue decreases from about 0.037 to about 0.027.

Referring to the graphs illustrated in FIGS. 8 to 11, it can be seen that the amount of color shift is affected as the thickness of the capping layer of the OLED display varies. Generally, as the thickness of the capping layer decreases, the amount of color shift gradually decreases. The amount of color shift for white represents the amount of color shift associated with the various thicknesses of the capping layer, and when the thickness of the capping layer decreases for the red, green, and blue colors, the amounts of color shift are respectively reduced.

When the thickness of the capping layer is about 830 Å, the amount of color shift for white is about 0.022. The amount of color shift for white is about similar level, i.e., 0.022, when the thickness of the capping layer is about 730 Å. In order to have a lower amount of color shift than when the thickness of the capping layer is about 830 Å, the thickness of the capping layer may be about 730 Å or less.

In FIGS. 8 to 11, the thickness of the capping layer represents a physical thickness and the graphs of FIGS. 8 to 11 show experimental results when a refractive index thereof is about 1.87. Accordingly, an optical thickness of the capping layer may be about 730 Å*1.87 or less, i.e., about 1400 Å or less.

Through the analysis of the graphs of FIGS. 4 to 11, the optical thickness of the capping layer may be about 600 Å*1.87 or more and about 730 Å*1.87 or less. That is, the optical thickness of the capping layer may be about 1100 Å or more and about 1400 Å or less, to improve luminous efficiency and minimize the amount of color shift associated with the viewing angle.

Hereinafter, the OLED display according to an exemplary embodiment of the present invention will be described with reference to FIG. 12.

The OLED display according to the present exemplary embodiment illustrated in FIG. 12 has substantially the same configuration as the OLED display illustrated with reference to FIGS. 1 to 3, and, thus, repeated description thereof will be omitted. The present exemplary embodiment differs from the aforementioned OLED display in that an emission layer includes a layer including only a host, which will be described below in detail.

Figure 12:
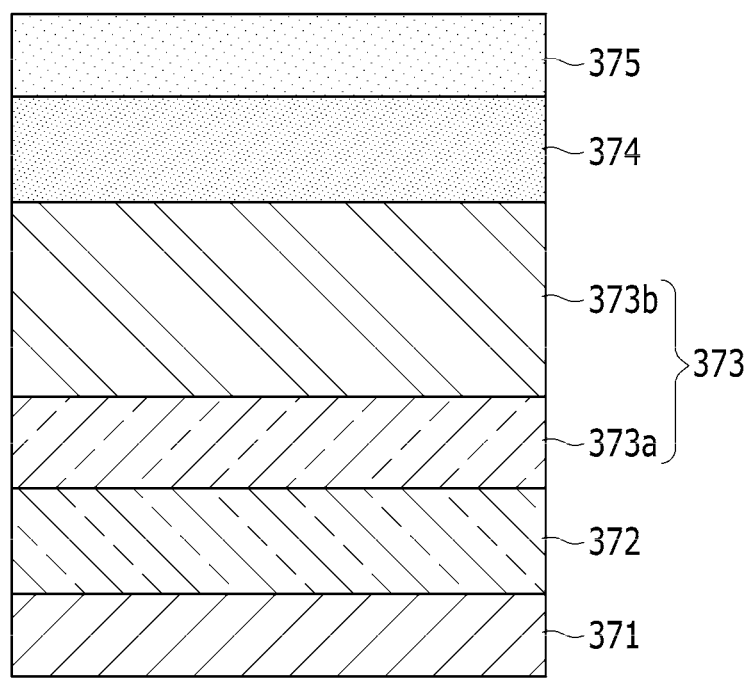
FIG. 12 is a cross-sectional view of an organic emission layer of an OLED display according to an exemplary embodiment of the present invention.

FIG. 12 is a cross-sectional view of an organic emission layer of the OLED display according to an exemplary embodiment of the present invention.

As shown in FIG. 12, the organic emission layer 370 of the OLED display according to the present exemplary embodiment includes the hole injection layer 371, the hole transporting layer 372, the emission layer 373, the electron transporting layer 374, and the electron injection layer 375. The hole injection layer 371, the hole transporting layer 372, the emission layer 373, the electron transporting layer 374, and the electron injection layer 375 may be sequentially disposed. It is noted that, however, a portion the layers above constituting the organic emission layer 370 may be omitted.

The emission layer 373 includes a first emission layer 373a and a second emission layer 373b. The first emission layer 373a includes a host, but not a dopant, and, thus, may be referred to as a non-doping layer. The second emission layer 373b includes a host and a dopant, and, thus, may be referred to as a doping layer. The first emission layer 373a contacts the hole transporting layer 372, and the second emission layer 373b contacts the electron transporting layer 374. It is noted that, however, the first emission layer 373a may alternatively contact the hole injection layer 371 and the second emission layer 373b may contact the electron injection layer 375. In this case, the hole transporting layer 372 or the electron transporting layer 374 may be omitted.

The second emission layer 373b is disposed in center and upper regions of the emission layer 373. A thickness ratio of the first emission layer 373a to the second emission layer 373b may be about 1:3. It is noted that, however, the thickness ratio of the first emission layer 373a to the second emission layer 373b may widely vary.

In the present exemplary embodiment, a driving voltage may be reduced, since the emission layer 373 includes the non-doping layer that includes the host but not the dopant, thereby increasing the luminous efficiency and reducing the color shift associated with the viewing angle.

Figure 24:
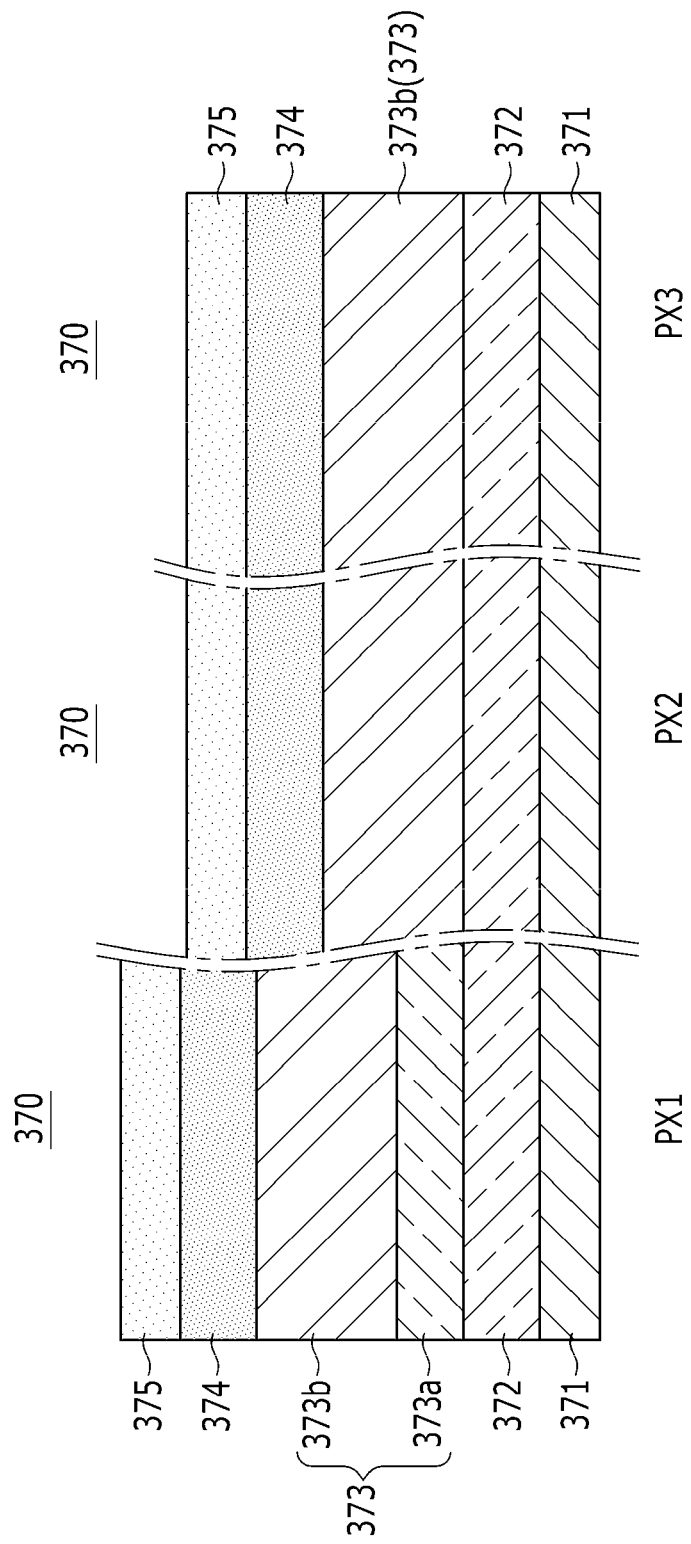
FIG. 24 is a cross-sectional view of an organic emission layer of an OLED display according to an exemplary embodiment of the present invention.

The OLED display according to the present exemplary embodiment may include pixels. In this case, the pixels may include first color pixels PX1, second color pixels PX2, and third color pixels PX3, as shown in FIG. 24. For example, the first color pixel PX1 may be a green pixel, the second color pixel PX2 may be a red pixel, and the third color pixel PX3 may be a blue pixel. In this case, only an emission layer 373 of the first color pixel PX1 may include the first emission layer 373a and the second emission layer 373b, and emission layers 373 of the second PX2 and third color pixels PX3 may include only the second emission layer 373b.

That is, only the green pixel may have a structure in which the emission layer 373 is partially doped. This is because the red and blue pixels may not be affected by the reduced driving voltage as the green pixel. It is noted that, however, all of the first color pixel, second color pixel, and third color pixel may alternatively have a structure in which the emission layer 373 is partially doped. In the above description, the first emission layer 373a and the second emission layer 373b are interchangeable with each other.

Hereinafter, an organic emission layer of an OLED display according to an exemplary embodiment of the present invention will be described with reference to FIG. 13.

Figure 13:
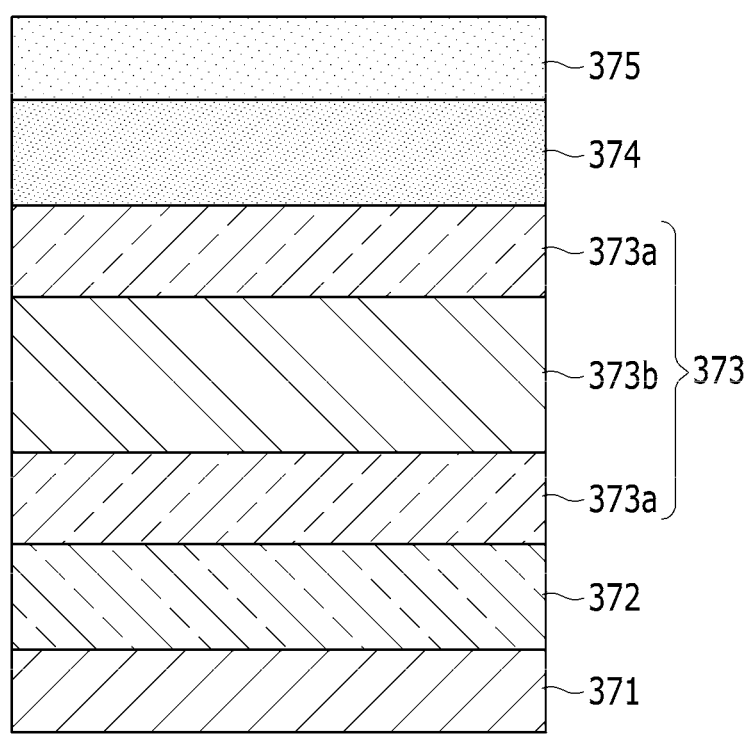
FIG. 13 is a cross-sectional view of an organic emission layer of an OLED display according to an exemplary embodiment of the present invention.

FIG. 13 is a cross-sectional view of an organic emission layer of the OLED display according to an exemplary embodiment of the present invention.

Referring to FIG. 13, the organic emission layer 370 of the OLED display according to the present exemplary embodiment includes a hole injection layer 371, a hole transporting layer 372, an emission layer 373, an electron transporting layer 374, and an electron injection layer 375.

The emission layer 373 includes a first emission layer 373a including a host, but not a dopant, and a second emission layer 373b including a host and a dopant. The first emission layer 373a contacts the hole transporting layer 372, and also contacts the electron transporting layer 374. It is noted that, however, the first emission layer 373a may alternatively contact the hole injection layer 371, and may also contact the electron injection layer 375. In this case, the hole transporting layer 372 or the electron transporting layer 374 may be omitted.

The second emission layer 373b is disposed in a center region of the emission layer 373. The first emission layers 373a are disposed above and below the second emission layer 373b. A thickness ratio of the first emission layer 373a to the second emission layer 373b may be about 1:1. It is noted that, however, the thickness ratio of the first emission layer 373a to is the second emission layer 373b may widely vary.

For comparison with the present exemplary embodiment, a structure of an OLED display according to a comparative embodiments will be described with reference to FIGS. 14 and 15.

Figure 14:
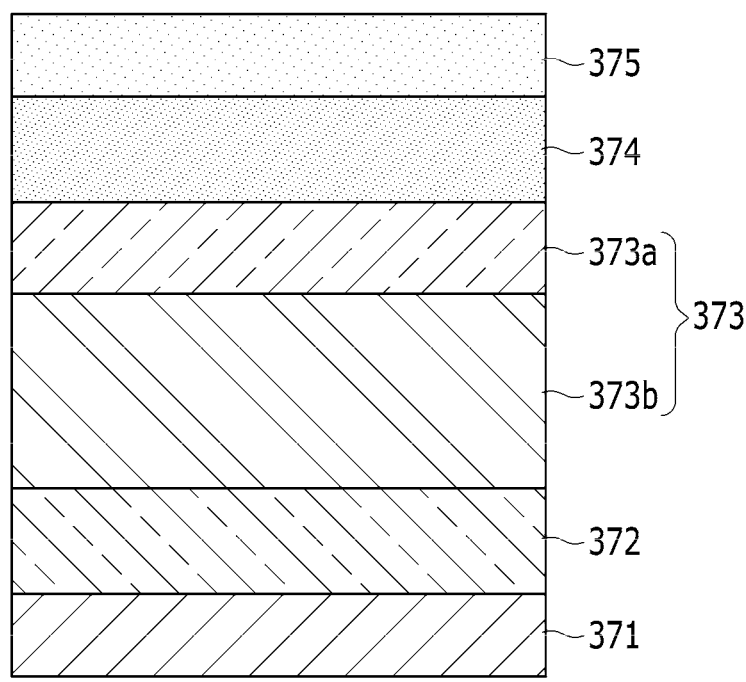
FIGS. 14 and 15 are cross-sectional views of an organic emission layer of an OLED display according to exemplary embodiments of the present invention.
Figure 15:
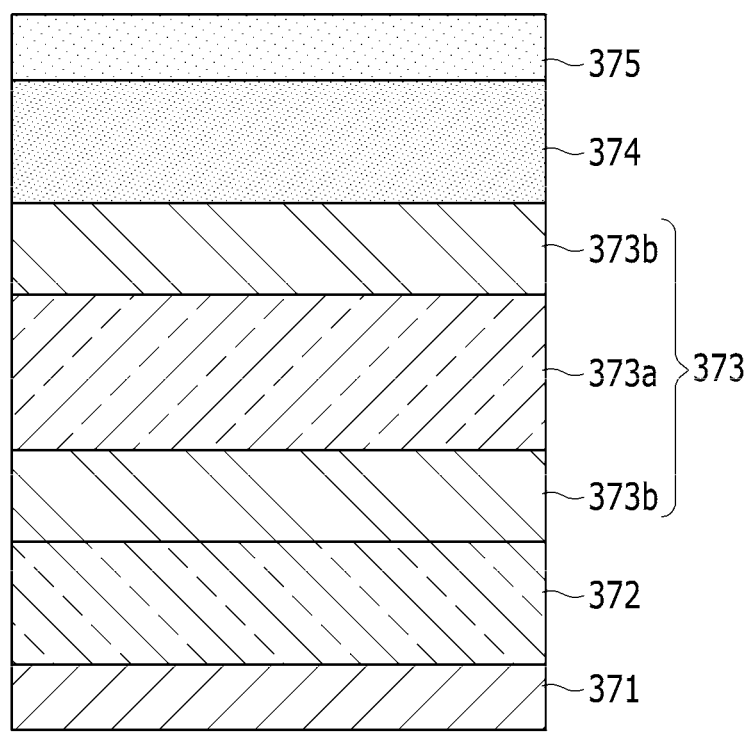

FIGS. 14 and 15 are cross-sectional views of an organic emission layer of an OLED display according to comparative embodiments.

Referring to FIG. 14, the emission layer 373 includes a first emission layer 373a including a host, but not a dopant, and a second emission layer 373b including a host and a dopant. The first emission layer 373a contacts an electron transporting layer 374, and the second emission layer 373b contacts a hole transporting layer 372. The second emission layer 373b is disposed in center and lower regions of the emission layer 373. A thickness ratio of the first emission layer 373a to the second emission layer 373b may be about 1:3.

Referring to FIG. 15, the emission layer 373 includes the first emission layer 373a that includes a host, but not a dopant, and the second emission layer 373b that includes a host and a dopant. The second emission layer 373b contacts the hole transporting layer 372, and also contacts the electron transporting layer 374. The first emission layer 373a is disposed in a center region of the emission layer 373. The second emission layers 373b are disposed above and below the first emission layer 373a. A thickness ratio of the first emission layer 373a to the second emission layer 373b may be about 1:1.

Figure 16:
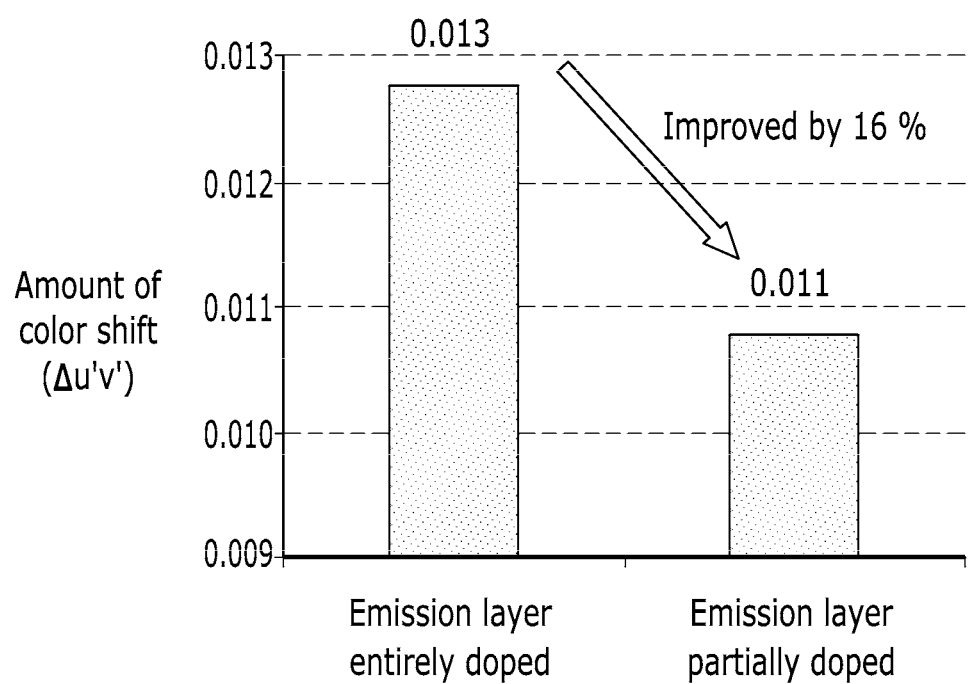
FIG. 16 is a graph showing an amount of color shift associated with a structure of an emission layer of an OLED display according to an exemplary embodiment of the present invention.

Referring to FIG. 16, an amount of color shift of the OLED display according to an exemplary embodiment of the present invention will be described.

FIG. 16 is a graph showing an amount of color shift associated with a structure of the emission layer of the OLED display according to an exemplary embodiment of the present invention. FIG. 16 shows an amount of color shift for green associated with a structure of an emission layer of a green pixel.

In a structure where the emission layer is entirely doped by a doping layer that includes a host and a dopant, the amount of color shift according to the viewing angle is about 0.013. In a structure where the emission layer is partially doped by a non-doping layer that includes a host, but not a dopant, the amount of color shift associated with the viewing angle is about 0.011. It can be seen that in the structure where the emission layer is partially doped, the amount of color shift associated with the viewing angle improves by about 16%.

In addition, when the optical thickness of the capping layer is about 1122 Å (600 A*1.87) or more and about 1365.1 Å (730 Å*1.87) or less, and the emission layer has the structure where the emission layer is partially doped, the amount of color shift associated with the viewing angle may be further improved.

Hereinafter, a driving voltage and luminous efficiency of the OLED display according to an exemplary embodiment of the present invention will be described with reference to FIGS. 17 and 18.

Figure 17:
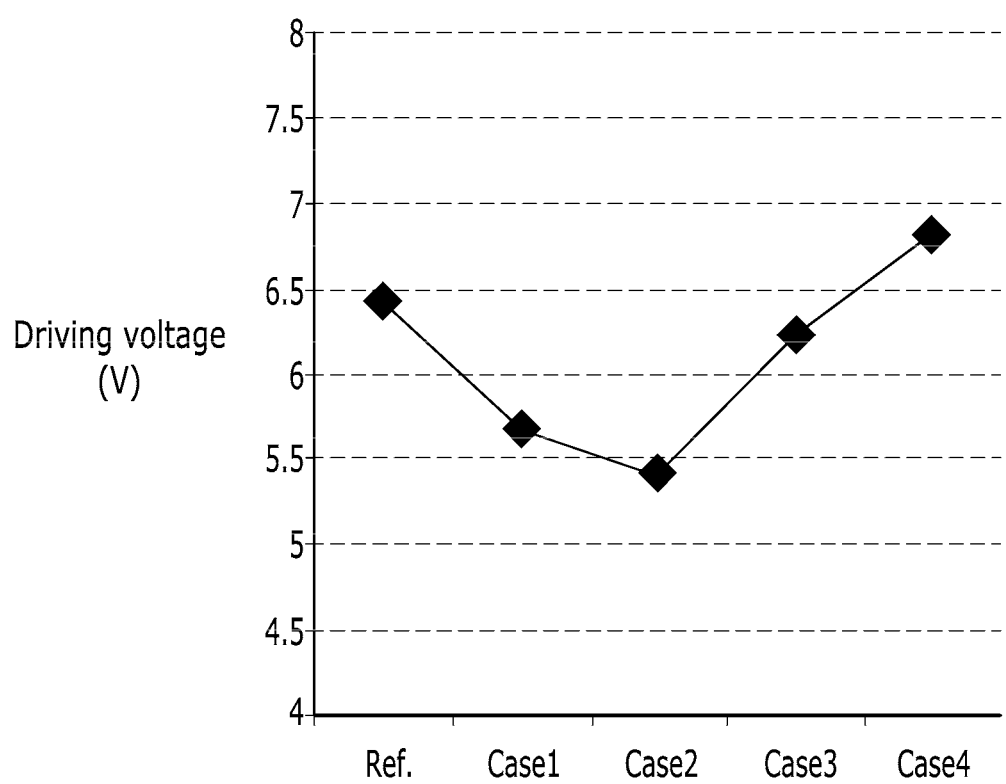
FIG. 17 is a graph showing a driving voltage associated with the structure of an emission layer of an OLED display according to an exemplary embodiment of the present invention.

FIG. 17 is a graph showing a driving voltage associated with the structure of the emission layer of the OLED display according to an exemplary embodiment of the present invention. FIG. 18 is a graph showing luminous efficiency associated with the structure of the emission layer of the OLED display according to an exemplary embodiment of the present invention.

Referring to FIG. 17, in the structure where the emission layer is entirely doped by a doping layer including a host and a dopant (Ref.), a driving voltage thereof is about 6.5V. A driving voltage of the OLED display according to the exemplary embodiment of present invention illustrated with reference to FIG. 12 is about 5.7V (case 1). That is, in the structure where the first emission layer contacts the hole transporting layer, the second emission layer contacts the electron transporting layer, and the thickness ratio of the first emission layer to the second emission layer is about 1:3, a driving voltage is decreased further than in the structure where the emission layer is entirely doped (Ref.). A driving voltage of the OLED display according to the exemplary embodiment of the present invention illustrated with reference to FIG. 13 is about 5.5V (case 2). That is, in the structure where the first emission layer contacts the hole transporting layer and the electron transporting layer, the second emission layer is disposed between the first emission layers, and the thickness ratio of the first emission layer to the second emission layer is about 1:1, a driving voltage is decreased further than in the structure where the emission layer is entirely doped (Ref.).

A driving voltage of the OLED display according to the comparative embodiment illustrated with reference to FIG. 13 is about 6.2V (case 3). That is, in the structure where the first emission layer contacts the electron transporting layer, the second emission layer contacts the hole transporting layer, and a thickness ratio of the first emission layer to the second emission layer is about 1:3, a driving voltage is decreased further than in the structure where the emission layer is entirely doped (Ref), but the difference between the driving voltages is not significant. A driving voltage of the OLED display according to the comparative embodiment illustrated with reference to FIG. 15 is about 6.9V (case 4). That is, in the structure where the second emission layer contacts the hole transporting layer and the electron transporting layer, the first emission layer is disposed between the second emission layers, and the thickness ratio of the first emission layer to the second emission layer is about 1:1, a driving voltage is increased further than in the structure where the emission layer is entirely doped (Ref.).

Figure 18:
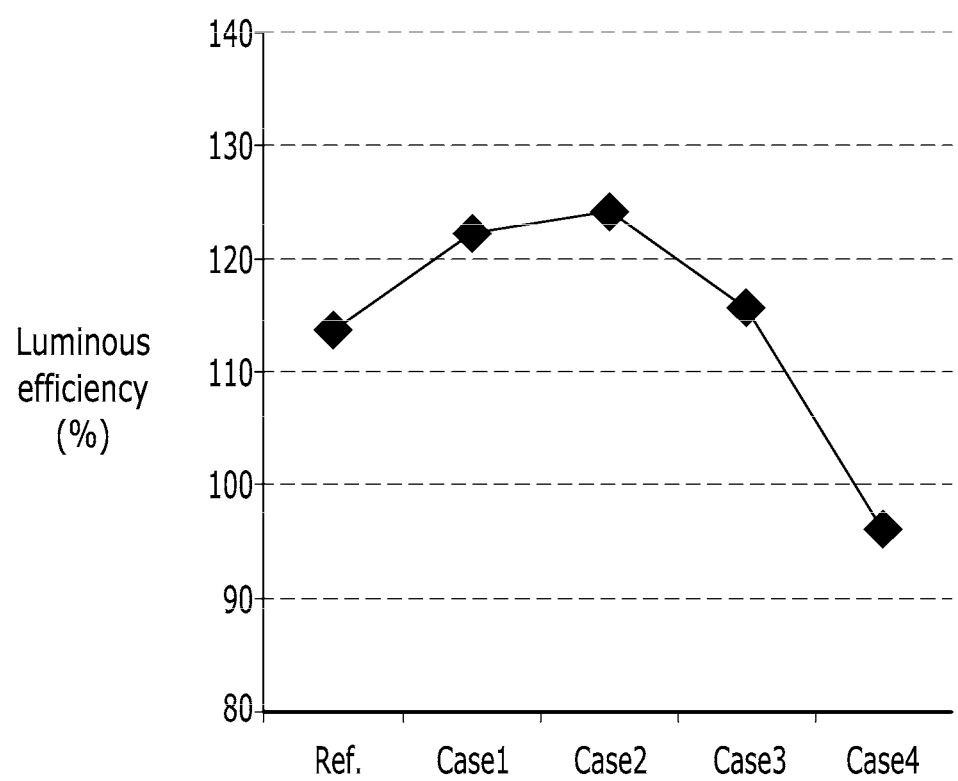
FIG. 18 is a graph showing luminous efficiency associated with the structure of an emission layer of an OLED display according to an exemplary embodiment of the present invention.

Referring to FIG. 18, in the structure where the emission layer is entirely doped (Ref.) by including a doping layer that includes a host and a dopant, luminous efficiency is about 113%. In case 1 illustrated with reference to FIG. 12, luminous efficiency thereof is about 122%. That is, in the structure where the first emission layer contacts the hole transporting layer, the second emission layer contacts the electron transporting layer, and the thickness ratio of the first emission layer and the second emission layer is about 1:3, the luminous efficiency increases further than in the structure where the emission layer is entirely doped (Ref.). In case 2 illustrated with reference to FIG. 13, luminous efficiency thereof is about 125%. That is, in the structure where the first emission layer contacts the hole transporting layer and the electron transporting layer, the second emission layer is disposed between the first emission layers, and the thickness ratio of the first emission layer and the second emission layer is about 1:1, luminous efficiency increases further than in the structure where the emission layer is entirely doped (Ref.).

In case 3, illustrated with reference to FIG. 14, luminous efficiency thereof is about 115%. That is, in the structure where the first emission layer contacts the electron transporting layer, the second emission layer contacts the hole transporting layer, and the thickness ratio of the first emission layer to the second emission layer about 1:3, the luminous efficiency increases further than in the structure where the emission layer is entirely doped (Ref), but the luminous efficiency is slightly different therefrom. In case 4, illustrated with reference to FIG. 15, luminous efficiency thereof is about 96%. That is, in the structure where the second emission layer contacts the hole transporting layer and the electron transporting layer, the first emission layer is disposed between the second emission layers, and the thickness ratio of the first emission layer to the second emission layer is about 1:1, the luminous efficiency decreases further than in the structure where the emission layer is entirely doped (Ref.).

Referring to FIGS. 17 and 18, where the emission layer is partially doped, the second emission layer is disposed in the center region of the emission layer, and the first emission layer contacts the hole injection layer or the hole transporting layer, according to the present exemplary embodiment, the driving voltage thereof may be decreased and luminous efficiency thereof may be increased further than in the structure where the emission layer is entirely doped. Even if the emission layer has the structure where the emission layer is partially doped (as in the Ref.), an effect of the reduced driving voltage may not be significant, or the driving voltage may be increased in the structure where the second emission layer contacts the hole injection layer or the hole transporting layer.

As described above, when the optical thickness of the capping layer is about 1122 Å (600 Å*1.87) or more and about 1365.1 Å (730 Å*1.87) or less, the emission layer is partially doped, the second emission layer is disposed in the center region of the emission layer, and the first emission layer contacts the hole injection layer or the hole transporting layer, the driving voltage thereof may be further decreased and the luminous efficiency can be further increased.

Hereinafter, an OLED display according to an exemplary embodiment of the present invention will be described with reference to FIG. 19.

Figure 19:
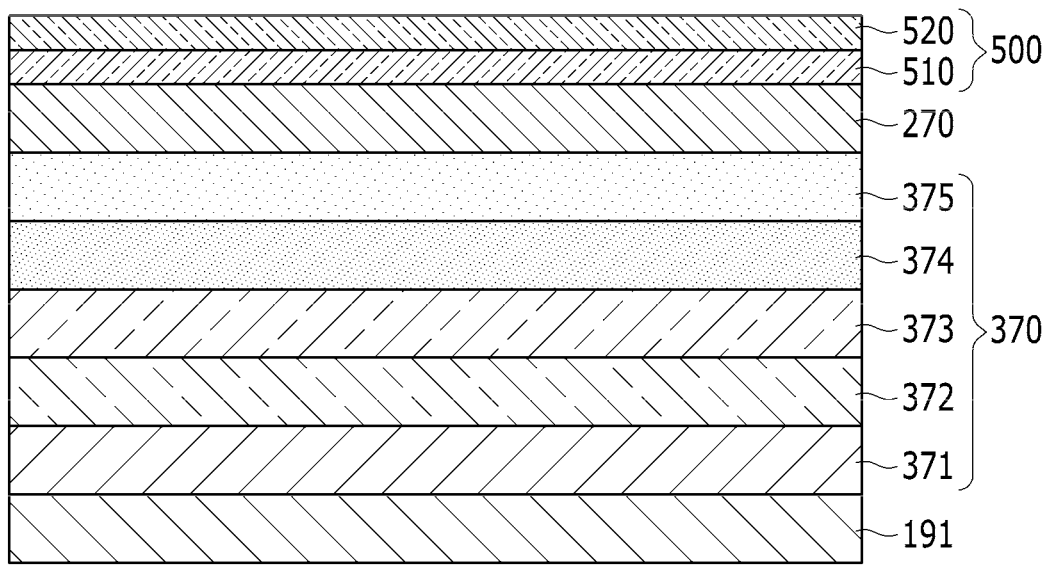
FIG. 19 is a cross-sectional view of an OLED of an OLED display according to an exemplary embodiment of the present invention.

Referring to FIG. 19, the OLED display according to the present exemplary embodiment has substantially the same configuration as the OLED display illustrated with reference to FIGS. 1 to 3, and, thus, detailed description thereof will be omitted. The present exemplary embodiment differs from the aforementioned OLED display in that a capping layer includes multiple layers, which will be described below in detail.

FIG. 19 is a cross-sectional view of an OLED of the OLED display according to an exemplary embodiment of the present invention.

The OLED according to the present exemplary embodiment has a structure, in which a pixel electrode 191, a hole injection layer 371, a hole transporting layer 372, an emission layer 373, an electron transporting layer 374, an electron injection layer 375, a common electrode 270, and a capping layer 500 are sequentially disposed.

The capping layer 500 includes first and second capping layers 510 and 520 that have different refractive indices from each other. The second capping layer 520 is disposed on the first capping layer 510. A refractive index of the second capping layer 520 is higher than a refractive index of the first capping layer 510. Accordingly, the first and second capping layers 510 and 520 include different materials. A difference between the refractive index of the first capping layer 510 and the refractive index of the second capping layer 520 is about 0.1 or more and about 1.4 or less. The refractive index of the first capping layer 510 may be about 1.2 or more and about 1.5 or less. The refractive index of the second capping layer 520 may be about 1.6 or more and about 2.6 or less. For example, the refractive index of the first capping layer 510 may be about 1.38, and the refractive index of the second capping layer 520 may be about 2.05.

An optical thickness of the first capping layer 510 may be about 60 Å or more and about 210 Å or less. When the refractive index of the first capping layer 510 is about 1.38, a physical thickness of the first capping layer 510 may be about 50 Å or more and about 150 Å or less. That is, the optical thickness of the first capping layer 510 may be about 50 Å*1.38 or more and about 150 Å*1.38 or less. A value range of the desirable physical thickness of the first capping layer 510 may vary depending on the refractive index of the first capping layer 510.

An optical thickness of the second capping layer 520 may be about 820 Å or more and about 1030 Å or less. When the refractive index of the second capping layer 520 is 2.05 or more, a physical thickness of the second capping layer 520 may be about 400 Å or more and about 500 Å or less. That is, the optical thickness of the second capping layer 520 may be about 400 Å*2.05 or more and about 500 Å*2.05 or less. A value range of the desirable physical thickness of the second capping layer 520 may vary depending on the refractive index of the second capping layer 520. As used herein, a value of the optical thickness may represent the optical thickness at a wavelength of about 550 nm. That is, the optical thickness is a value that is obtained by multiplying the physical thickness with the refractive index when light of about 550 nm passes through the capping layer 500.

Hereinafter, luminous efficiency associated with thicknesses of first and second capping layers of the OLED according to an exemplary embodiment of the present invention will be described with reference to FIGS. 20 and 21.

Figure 20:
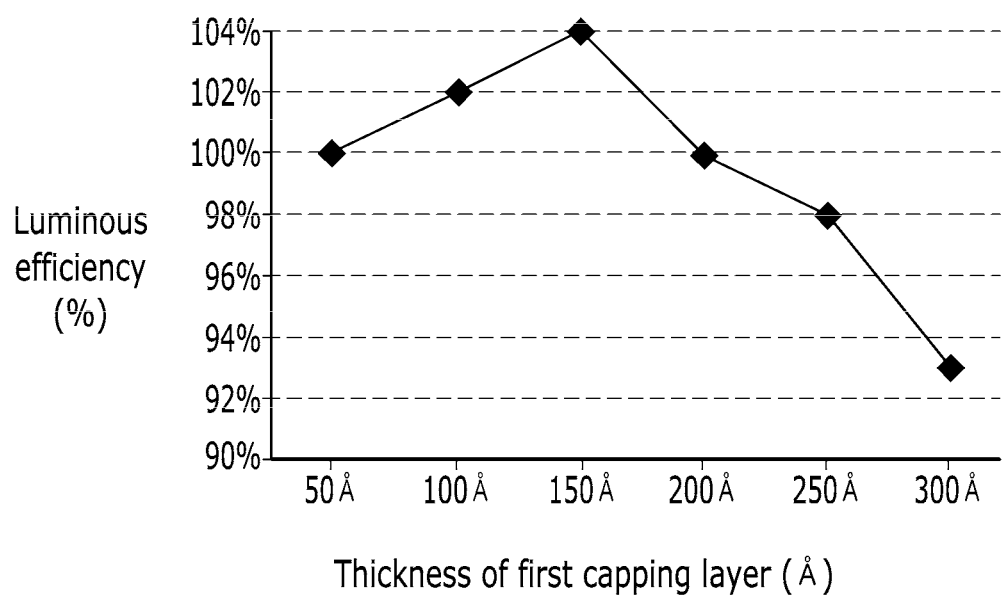
FIG. 20 is a graph showing luminous efficiency associated with a thickness of a first capping layer of an OLED display according to an exemplary embodiment of the present invention.

FIG. 20 is a graph showing luminous efficiency associated with a thickness of a first capping layer of the OLED display according to an exemplary embodiment of the present invention. FIG. 21 is a graph showing luminous efficiency associated with a thickness of a second capping layer of the OLED display according to an exemplary embodiment of the present invention.

Referring to FIG. 20, as a first thickness of the first capping layer increases from about 50 Å to about 150 Å, luminous efficiency gradually increases. When the first thickness of the first capping layer increases from a point where the first thickness of the first capping layer is about 150 Å, the luminous efficiency gradually decreases.

Figure 21:
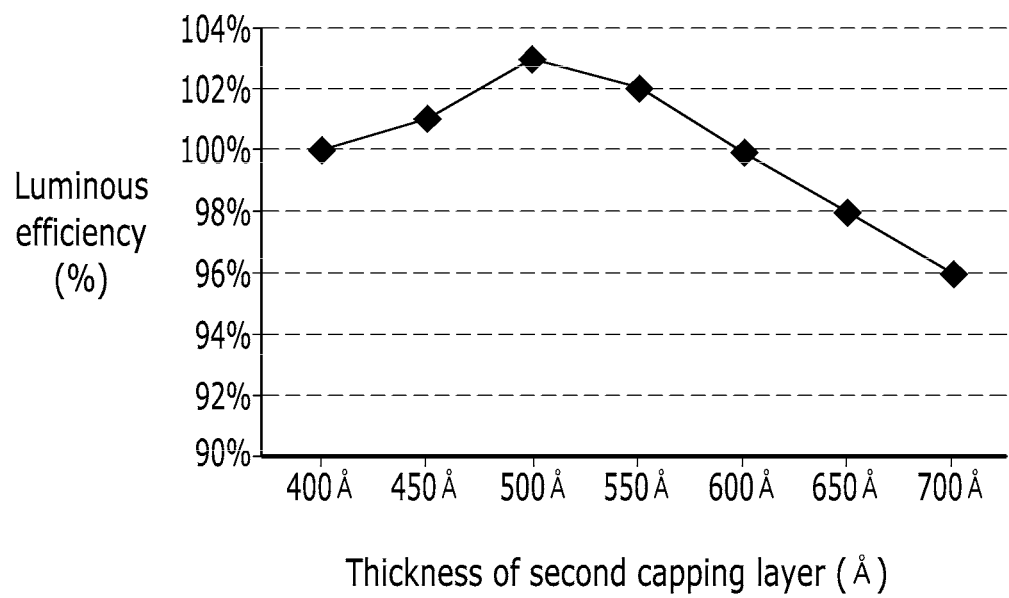
FIG. 21 is a graph showing luminous efficiency associated with a thickness of a second capping layer of an OLED display according to an exemplary embodiment of the present invention.

Referring to FIG. 21, as a second thickness of the second capping layer increases from about 400 Å to about 500 Å, the luminous efficiency gradually increases. When the second thickness of the second capping layer increases from a point where the second thickness of the second capping layer is about 500 Å, the luminous efficiency gradually decreases.

Hereinafter, an amount of color shift associated with the thicknesses of the first and second capping layers of the OLED display according to an exemplary embodiment of the present invention will be described with reference to FIGS. 22 and 23.

Figure 22:
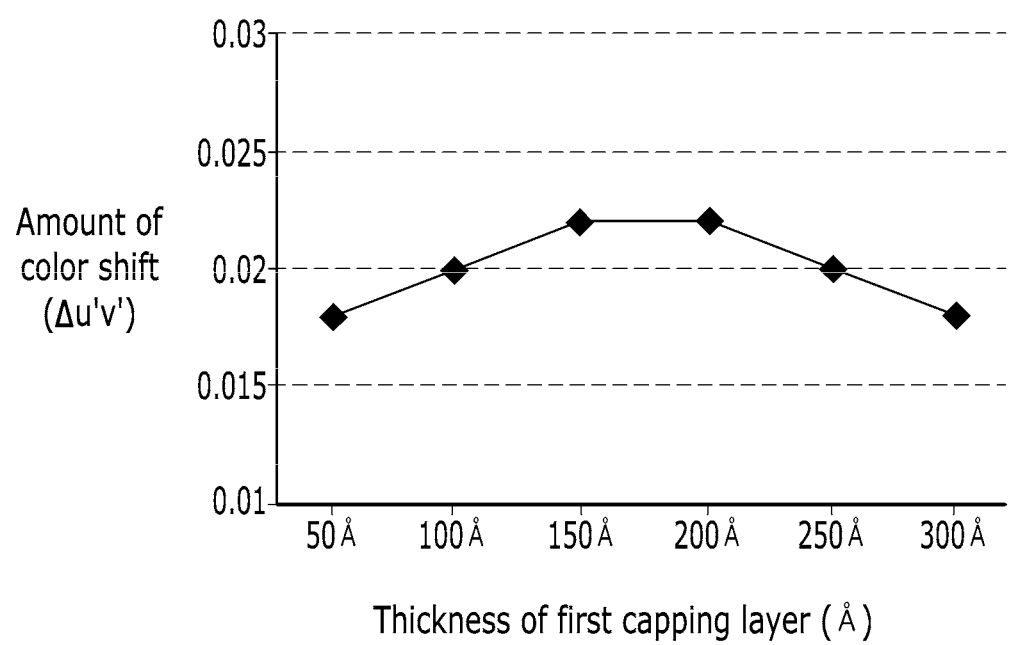
FIG. 22 is a graph showing an amount of color shift associated with the thickness of a first capping layer of an OLED display according to an exemplary embodiment of the present invention.

FIG. 22 is a graph showing an amount of color shift associated with the thickness of the first capping layer of the OLED display according to an exemplary embodiment of the present invention. FIG. 23 is a graph showing amount of color shift associated with the thickness of the second capping layer of the OLED display according to an exemplary embodiment of the present invention.

Referring to FIG. 22, as the first thickness of the first capping layer increases from about 50 Å to about 150 Å, an amount of color shift gradually increases. When the first thickness of the first capping layer is between about 150 Å and about 200 Å, the amount of color shift does not vary, but the amount of color shift gradually decreases when the first thickness of the first capping layer increases from a point where the first thickness is about 200 Å.

Figure 23:
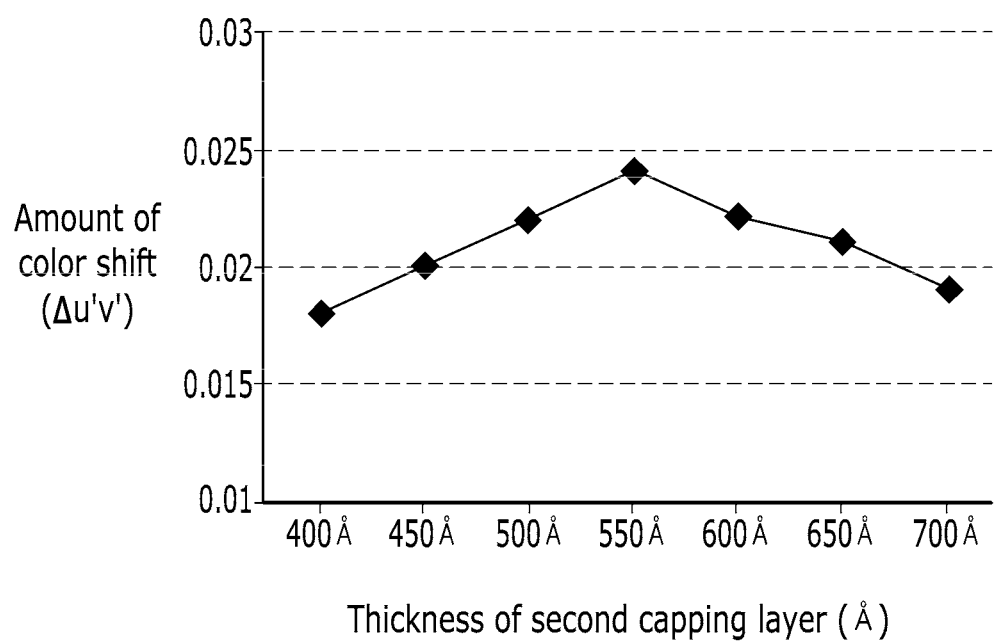
FIG. 23 is a graph showing an amount of color shift associated with the thickness of a second capping layer of an OLED display according to an exemplary embodiment of the present invention.

Referring to FIG. 23, as the second thickness of the second capping layer increases from about 400 Å to about 550 Å, the amount of color shift gradually increases. When the second thickness of the second capping layer increases from a point where the second thickness of the second capping layer is about 550 Å, the amount of color shift gradually decreases.

In consideration of data from FIGS. 20 to 23, a desirable thickness range of the first and second capping layers may be obtained. When considering only the luminous efficiency, the first thickness of the capping layer may be about 50 Å to about 200 Å, and the second thickness of the capping layer may be about 400 Å to about 600 Å. In the present exemplary embodiment, both the amount of color shift associated with the viewing angle and the luminous efficiency are taken into account. Accordingly, the first thickness of the capping layer may be about 50 Å and about 150 Å, and the second thickness of the capping layer may be about 400 Å and about 500 Å.

The thicknesses of the first and second capping layers in FIGS. 20 to 23 represent the physical thicknesses, and the graphs of FIGS. 20 to 23 show experimental results when a refractive index of the first capping layer is 1.38 and a refractive index of the second capping layer is 2.05. Accordingly, an optical thickness of the first capping layer may be about 50 Å*1.38 or more and about 150 Å*1.38 or less, and an optical thickness of the second capping layer may be about 400 Å*2.05 or more and about 500 Å*2.05 or less.

In addition, the optical thickness of the first capping layer may be about 60 Å or more and about 210 Å or less, and the optical thickness of the second capping layer may be about 820 Å or more and about 1030 Å or less, the emission layer may have the structure where the emission layer is partially doped, the second emission layer may be disposed in the center region of the emission layer, and the first emission layer can contact the hole injection layer or the hole transporting layer, thereby further increasing the luminous efficiency and further improving the amount of color shift associated with the viewing angle.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light emitting diode (OLED) display, comprising:
   a first color pixel, a second color pixel, and a third color pixel on a substrate, each of the first, second, and third color pixels comprising:
      a first electrode disposed on the substrate;
      an organic emission layer disposed on the first electrode;
      a second electrode disposed on the organic emission layer; and
      a capping layer disposed on the second electrode,
   wherein:
   the first color pixel is configured to emit green light, and the second and third color pixels are each configured to emit a color of light other than green;
   the organic emission layer of the first color pixel comprises a first emission layer and a second emission layer each being configured to emit light;
   the organic emission layer of the second color pixel or the third color pixel comprises a third emission layer configured to emit light;
   the second emission layer and the third emission layer comprise both a host and a dopant; and
   the first emission layer comprises the host, and does not comprise any dopants therein.

2. The OLED display of claim 1, wherein a refractive index of the capping layer is in a range of about 1.6 to about 2.6.

3. The OLED display of claim 2, wherein a physical thickness of the capping layer is in a range of about 600 Å to about 730 Å when the refractive index of the capping layer is about 1.87.

4. The OLED display of claim 2, wherein the refractive index of the capping layer is measured at a wavelength of about 550 nm.

5. The OLED display of claim 1, wherein the capping layer comprises an organic material or an inorganic material.

6. The OLED display of claim 5, wherein the capping layer comprises at least one of a triamine derivative, an arylenediamine derivative, CBP, and tris(8-hydroxyquinoline) aluminum (Alq3).

7. The OLED display of claim 1, wherein an optical thickness of the capping layer is in a range of about 1100 Å to about 1400 Å.

8. The OLED display of claim 1, wherein the organic emission layer of the first color pixel further comprises:
   a hole injection layer and a hole transporting layer disposed on the first electrode; and
   an electron transporting layer and an electron injection layer.

9. The OLED display of claim 8, wherein:
the first emission layer contacts the hole injection layer or the hole transporting layer; and
the second emission layer contacts the electron transporting layer or the electron injection layer.

10. The OLED display of claim 9, wherein:
the organic emission layer of the first color pixel further comprises another first emission layer; and
the second emission layer is disposed between the first emission layer and the another first emission layer.

11. The OLED display of claim 10, wherein the second emission layer is disposed in a center region of the organic emission layer of the first color pixel.

12. The OLED display of claim 10, wherein:
the first emission layer disposed on the second emission layer contacts the hole injection layer or the hole transporting layer; and
the another first emission layer disposed under the second emission layer contacts the electron transporting layer or the electron injection layer.

13. The OLED display of claim 1, wherein:
the organic emission layer of the first color pixel further comprises another first emission layer; and
the second emission layer is disposed between the first emission layer and the another first emission layer.

* * * * *